United States Patent
Asari

(10) Patent No.: US 12,332,427 B2
(45) Date of Patent: Jun. 17, 2025

(54) LIGHT DEFLECTOR

(71) Applicant: Stanley Electric Co., Ltd., Tokyo (JP)

(72) Inventor: Tomotaka Asari, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 519 days.

(21) Appl. No.: 17/743,457

(22) Filed: May 13, 2022

(65) Prior Publication Data

US 2022/0365338 A1 Nov. 17, 2022

(30) Foreign Application Priority Data

May 14, 2021 (JP) .................. 2021-082273

(51) Int. Cl.
*G02B 26/08* (2006.01)
*B81B 3/00* (2006.01)
*G02B 26/12* (2006.01)

(52) U.S. Cl.
CPC ........ *G02B 26/0858* (2013.01); *B81B 3/0021* (2013.01); *G02B 26/127* (2013.01); *B81B 2201/042* (2013.01)

(58) Field of Classification Search
CPC ... G06F 3/044; G02B 26/0858; G02B 26/105; H02N 2/028; H02N 2/22
See application file for complete search history.

(56) References Cited

U.S. PATENT DOCUMENTS

| | | | | |
|---|---|---|---|---|
| 2010/0309536 A1* | 12/2010 | Akanuma | .......... | G02B 26/0858 359/200.8 |
| 2012/0062970 A1* | 3/2012 | Yamada | ................ | G02B 7/1821 310/323.01 |
| 2012/0250124 A1 | 10/2012 | Choi et al. | | |
| 2015/0277107 A1* | 10/2015 | Aimono | ............. | G02B 26/0858 359/198.1 |
| 2018/0039074 A1* | 2/2018 | Oyama | .............. | G02B 26/0858 |
| 2019/0189896 A1 | 6/2019 | Miyachi | | |
| 2019/0258049 A1* | 8/2019 | Sakurai | ............. | G02B 26/0858 |
| 2020/0393669 A1 | 12/2020 | Shiraishi | | |

(Continued)

FOREIGN PATENT DOCUMENTS

| | | |
|---|---|---|
| JP | 5168659 B2 | 3/2013 |
| WO | 2011/027742 A1 | 3/2011 |
| WO | WO-2020246245 A1 * | 12/2020 ......... G02B 26/0858 |

OTHER PUBLICATIONS

Extended European Search Report issued Oct. 13, 2022, in corresponding European Patent Application No. 22172812.4, 9 pp.

(Continued)

*Primary Examiner* — Jonathan Y Jung
(74) *Attorney, Agent, or Firm* — XSENSUS LLP

(57) ABSTRACT

A light deflector 2 includes: a mirror section 9 that reflects light; a movable frame 8 provided in such a manner as to surround the mirror section 9; a pair of torsion bars 13a and 13b having one end of each torsion bar connected to the mirror section 9 and the other end thereof connected to the movable frame 8 on a Y-axis; and semi-annular piezoelectric actuators 10a and 10b that are provided on the movable frame 8 and rotate the torsion bars 13a and 13b around the Y-axis in a reciprocating manner. The torsion bars 13a and 13b each have a constricted shape in which the transverse width at both end parts is the largest and the transverse width gradually decreases toward the central part thereof in a length direction.

10 Claims, 6 Drawing Sheets

(56) References Cited

U.S. PATENT DOCUMENTS

| | | | |
|---|---|---|---|
| 2021/0041687 A1* | 2/2021 | Yokota | G01S 17/88 |
| 2021/0058592 A1* | 2/2021 | Akanuma | G02B 26/0833 |
| 2021/0156964 A1* | 5/2021 | Akanuma | G02B 26/0858 |
| 2021/0286167 A1* | 9/2021 | Shinkawa | F21S 41/16 |
| 2022/0236556 A1* | 7/2022 | Akiyama | G02B 26/0858 |

OTHER PUBLICATIONS

Office Action issued on Oct. 1, 2024, in corresponding Japanese patent Application No. 2021-082273, 8 pages.

* cited by examiner

ENTIRE TORSION BAR

SECTION I-I

REFERENCE EXAMPLE A

REFERENCE EXAMPLE B

FIG.8

|  | Conventional (Linear) | New 1 | New 2 | Reference example A | Reference example B |
|---|---|---|---|---|---|
| Resonance frequency [Hz] | 100% | 102% | 99% | 106% | 109% |
| Limit deflection angle [°] | 100% | 134% | 147% | 98% | 89% |

FIG.9

|  | Conventional (Linear) | New (constricted shape) | New / Conventional |
|---|---|---|---|
| Transverse width $W_2$ [μm] | 220 | 160 | 73% |
| Resonance frequency [Hz] | 19,894 | 19,886 | 100% |
| Limit deflection angle [°] | 11.9 | 13.8 | 116% |
| Rotational torque [ratio] | 1 | 0.4 | 40% |

LIGHT DEFLECTOR

CROSS-REFERENCE TO RELATED APPLICATION

This application claims priority to Japanese Patent Application No. 2021-082273, filed on May 14, 2021, the entire disclosure of which is incorporated herein by reference.

BACKGROUND OF THE INVENTION

1. Field of the Invention

The present invention relates to a light deflector that uses torsion bars to rotate a mirror section in a reciprocating manner.

2. Description of the Related Art

Hitherto, there have been known a light deflector fabricated using a MEMS (micro-electromechanical systems) technology, and an optical scanning device provided with the light deflector. The light deflector has a mirror section that rotates around a rotation axis in a reciprocating manner, and reflects light from a light source in a direction corresponding to the deflection angle of the mirror section so as to perform optical scanning of a predetermined area.

In the optical scanning device of Patent Document 1, a movable plate section has a rib for reinforcement in the vicinity of each connection of a movable plate and a torsion beam on the back side of a reflective surface. According to this optical scanning device, the part near the center of rotation where distortion is large is reinforced, so that an increase in weight and moment of inertia of the movable plate section can be suppressed (Patent Document 1/paragraph 0026, FIG. 2).

Patent Document 1: Japanese Patent No. 5168659

However, in the aforesaid optical scanning device, the provided ribs may cause discontinuity in the rigidity of the root portion of the torsion beam. There has been a possibility of damage to the device if a part of the torsion beam is subjected to concentrated stress generated when the movable plate section is driven and the scanning speed of light is increased.

SUMMARY OF THE INVENTION

The present invention has been made in view of the circumstances described above, and an object of the invention is to provide a light deflector that has high rigidity and is less likely to be damaged when made smaller and thinner.

A light deflector in accordance with the present invention includes: a mirror section that reflects light; a frame body provided in such a manner as to surround the mirror section; a pair of torsion bars having one end of each torsion bar connected to the mirror section and the other end thereof connected to the frame body on an axis passing through a center of the mirror section; and a piezoelectric actuator that is provided on the frame body and rotates the torsion bars around the axis in a reciprocating manner, wherein the torsion bar has a constricted shape in which, in the case where a connection between the torsion bar and the mirror section is defined as a first connection and a connection between the torsion bar and the frame body is defined as a second connection, a transverse width at the first connection and the second connection is the largest and the transverse width gradually decreases toward a central part in a length direction.

In the light deflector of the present invention, the piezoelectric actuator uses the pair of torsion bars to rotate the mirror section around the axis in a reciprocating manner. One end of each of the torsion bars is connected to the mirror section at the first connection, and the other end of each thereof is connected to the frame body, on which the piezoelectric actuator is provided, at the second connection.

In order to relieve the stress of a torsional motion applied to the torsion bars, each of the torsion bars has a constricted shape in which the transverse widths of the first connection and the second connection are the largest and the transverse widths gradually decrease toward the central part in the longitudinal direction. As compared with a conventional torsion bar that has a wide transverse width at the central part and has a linear shape, the light deflector of the present invention has a narrower transverse width at the central part and has a smaller rotational torque. Consequently, the light deflector of the present invention suppresses distortion and has higher rigidity, so that the light deflector can be made less likely to be damaged when made smaller and thinner.

In the light deflector of the present invention, in the case where the transverse width of the first connection or the second connection of the torsion bar is denoted by $W_1$, the transverse width of a central part in the length direction of the torsion bar is denoted by $W_2$, and $(W_1-W_2)/2=W_3$ is applied, a transverse width $W_4$ of the torsion bar at a middle part between the first connection or the second connection and the central part in the length direction is preferably determined by $W_2+0.30$ to $0.35 \times W_3$.

The resonance frequency and the limit deflection angle when the mirror section is rotated in a reciprocating manner depend on the shape of the torsion bars. By setting the transverse width $W_4$ of the torsion bars within the aforesaid range, the characteristics of the resonance frequency and the limit deflection angle of the mirror section can be enhanced.

Further, in the light deflector of the present invention, when the mirror section has a circular shape or an elliptical shape, the end edge of the torsion bar on the first connection side is preferably on a tangent of the circular shape or the elliptical shape of the mirror section, the tangent being orthogonal to the axis.

When the mirror section has a circular shape or an elliptical shape, the end edge of the torsion bar on the first connection side (on the mirror section side) is set to be on the tangent. This makes the length of the torsion bar clear.

Further, in the light deflector of the present invention, when the frame body has a circular shape or an elliptical shape, the end edge of the torsion bar on the second connection side is preferably on a straight line that connects end points of curves constituting the circular shape or the elliptical shape of the frame body.

When the frame body has a circular shape or an elliptical shape, the end edge of the torsion bar on the second connection side (on the frame body side) is set to be on the straight line. This makes the length of the torsion bar clear.

Further, in the light deflector of the present invention, preferably, the torsion bar has a linear part that includes a central part in a length direction, and the linear part is 25% or less of a total length of the torsion bar.

The torsion bar may have a linear part at the central part in the length direction thereof. When the length of the linear part is 25% or less of the total length of the torsion bar, then the light deflector has the same performance as that of a torsion bar having a constricted shape consisting of only curves.

BRIEF DESCRIPTION OF THE DRAWINGS

FIG. 8 is a diagram illustrating the comparison of the performances of torsion bars having different shapes; and FIG. 9 is a diagram illustrating the comparison of the performances of a torsion bar having a conventional structure and a torsion bar having a new structure.

DESCRIPTION OF THE PREFERRED EMBODIMENTS

Figure 1:
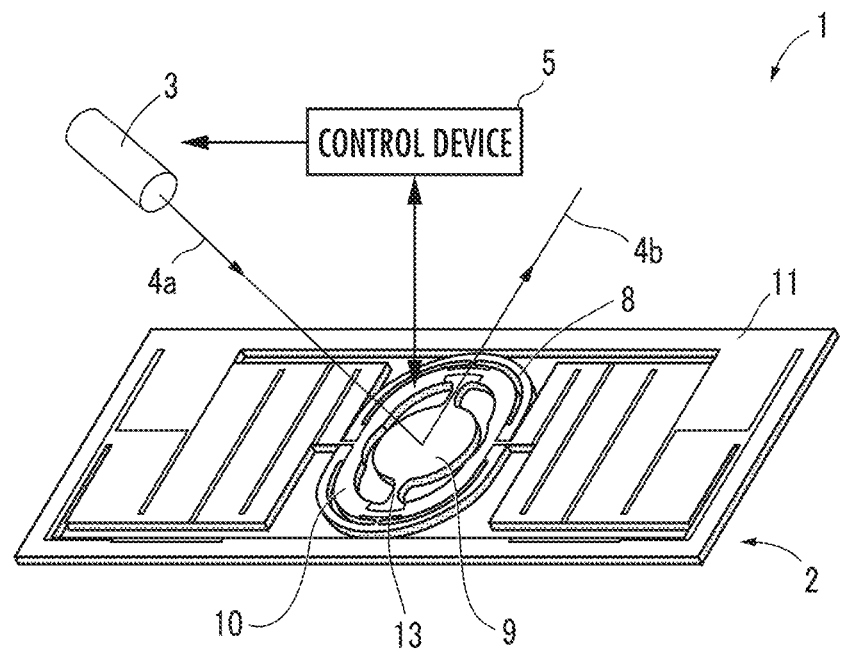
FIG. 1 is a configuration diagram of an optical scanner module.

First, the configuration of an optical scanner module 1 will be described with reference to FIG. 1.

The optical scanner module 1 is a component used in, for example, a pico-projector, smart glasses (a wearable device), and a headlamp for an ADB (Adaptive Driving Beam). The optical scanner module 1 is composed of a light deflector 2, a light source 3, a control device 5, and the like.

The light deflector 2 is fabricated using a semiconductor process and the MEMS technology. The light deflector 2 is a device adapted to reflect the light incident from a predetermined direction by a micromirror (a mirror section 9), which rotates around an axis, and to emit the reflected light as scanning light.

A movable frame 8 (the "frame body" in the present invention), which is an inner frame of the light deflector 2, includes the mirror section 9, a piezoelectric actuator 10, torsion bars 13, and the like. Laser light 4a emitted from the light source 3 is incident upon the mirror section 9 and reflected, and reflected light (laser light 4b) scans, for example, the projection plane of a pico-projector.

The light source 3 is a laser diode (LD) having a center wavelength of approximately 450 nm, and emits blue light (the laser light 4a). As the light source, a light emitting diode (LED) or the like may alternatively be used.

The control device 5 transmits control signals to the movable frame 8 and the light source 3. The piezoelectric actuator 10 in the movable frame 8 is driven by the control signals, and the torsion bars 13 are twisted, thereby rotating the mirror section 9 in a reciprocating manner. Further, the control signals turn the laser light 4a of the light source 3 ON or OFF and also controls the brightness of the laser light 4a.

Figure 2:
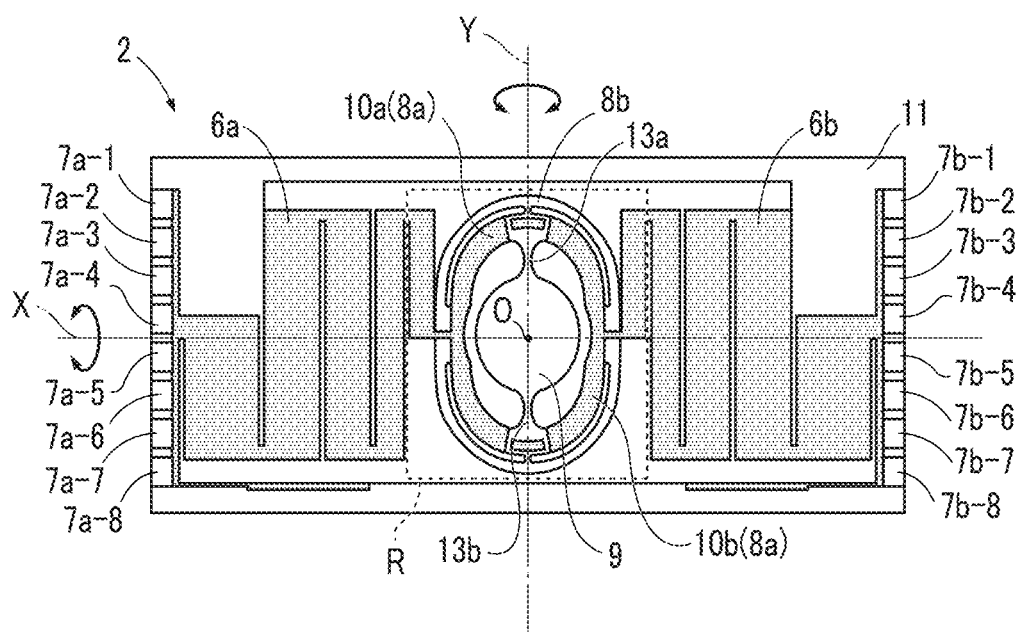
FIG. 2 is a diagram illustrating the details of a light deflector of the present invention.

Referring now to FIG. 2, the details of the light deflector 2 of the present embodiment will be described.

In an initial state, the mirror section 9 is disposed such that a normal line extending from a center O thereof to the front side is directed straight toward the front of the light deflector 2. The mirror section 9 is supported by the torsion bars 13 (13a, 13b) in the direction of a Y-axis (the "axis" in the present invention), and is disposed substantially at the center of the movable frame 8.

For the reflection plane of the mirror section 9, a metal thin film of Au, Pt, Al, or the like is formed by, for example, a sputtering method or an electron beam deposition method. The shape of the mirror section 9 is not limited to a circular shape, and may be an elliptical shape or other shapes.

The movable frame 8 has a double structure that includes an inner frame body 8a and an outer frame body 8b, and is provided in such a manner as to surround the mirror section 9. The piezoelectric actuator 10 is composed of a semi-annular piezoelectric actuator 10a on the left side in a front view and a semi-annular piezoelectric actuator 10b on the right side in the front view, and is provided on the upper surface of the inner frame body 8a. In other words, the inner frame body 8a is an annular driving section having a plurality of piezoelectric parts annularly arranged.

The torsion bar 13 is composed of a torsion bar 13a on the upper side in the front view and a torsion bar 13b on the lower side in the front view. One end of each of the torsion bars 13a and 13b is connected to the mirror section 9 and the other end of each thereof is connected to the inner frame body 8a. The manner in which the torsion bars 13a and 13b are connected as described above stabilizes the reciprocating rotation of the mirror section 9 in the Y-axis direction. The shape of the torsion bar will be described in detail later.

The semi-annular piezoelectric actuators 10a and 10b ("the piezoelectric actuator" in the present invention) are provided on the inner frame body 8a. Further, the inner frame body 8a is connected with the torsion bars 13a and 13b on the Y-axis and connected with the outer frame body 8b on an X-axis.

Each of the semi-annular piezoelectric actuators 10a and 10b has a structure in which a piezoelectric film of piezoelectric zirconate titanate (PZT) is sandwiched between a lower electrode and an upper electrode by a semiconductor process. Applying a voltage to the piezoelectric film through the lower electrode and the upper electrode causes the semi-annular piezoelectric actuators 10a and 10b to bend and deform, thus twisting the torsion bars 13a and 13b.

In the light deflector 2, the movable frame 8 is disposed at the center of an outer frame support 11, and bellows-shaped piezoelectric actuators 6a and 6b are disposed on both sides of the movable frame 8. The bellows-shaped piezoelectric actuators 6a and 6b are connected to the ends on an X-axis of the outer frame body 8b and the outer frame support 11.

The bellows-shaped piezoelectric actuators 6a and 6b have a structure in which a plurality of cantilevers are arranged so as to be adjacent to each other in the longitudinal direction and folded back at the vertical ends thereof to be connected in series. The bellows-shaped piezoelectric actuators 6a and 6b are driven thereby to rotate the movable frame 8 around the X-axis in a reciprocating manner.

As a result, when reflecting the laser light 4a by the mirror section 9, the light deflector 2 can emit the light to the front of the light deflector 2. In addition, the light deflector 2 can perform scanning in two directions, namely, the X-axis direction and the Y-axis direction.

Electrode pads 7a-1 to 7a-8 (hereinafter referred to as "the electrode pads 7a") are disposed on the left side in the front view of the outer frame support 11. Further, electrode pads 7b-1 to 7b-8 (hereinafter referred to as "the electrode pads 7b") are disposed on the right side in the front view of the outer frame support 11. The electrode pads 7a and 7b are electrically connected such that a driving volt can be applied to the electrodes of the bellows-shaped piezoelectric actuators 6a and 6b and the semi-annular piezoelectric actuators 10a and 10b.

Figure 3:
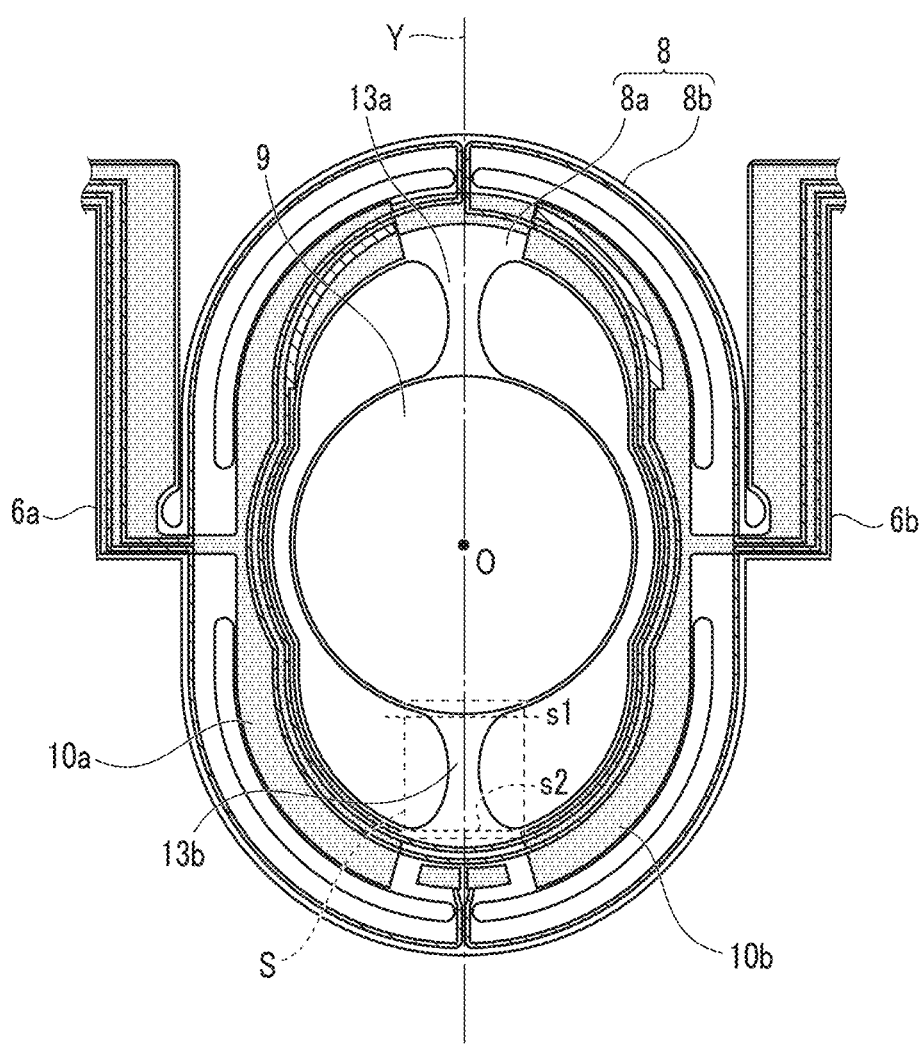
FIG. 3 is an enlarged view of an area R in FIG. 2.
Figure 4:
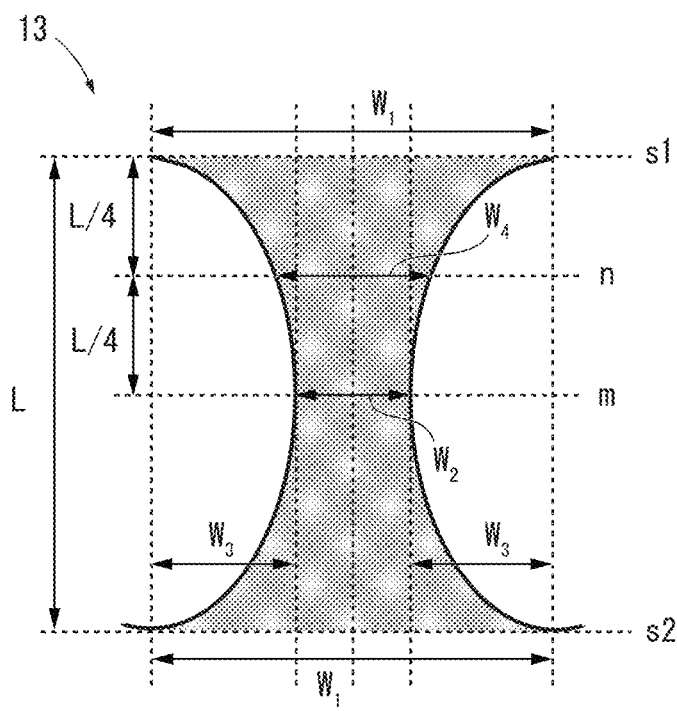
FIG. 4 is an enlarged view of an area S in FIG. 3.

Referring now to FIG. 3 to FIG. 5, the torsion bar of the present embodiment will be described in detail.

First, FIG. 3 is an enlarged view of an area R in FIG. 2. Each of the torsion bars 13a and 13b of the present embodiment has a constricted shape in which the transverse width of an end portion thereof is the largest and the transverse width gradually decreases toward the central part in the longitudinal direction of the torsion bars 13a and 13b. In the following description, the torsion bar 13b will be taken as an example.

As illustrated, when the mirror section 9 has a circular shape, then a tangent s1 of the mirror section 9 that is orthogonal to the Y-axis is the end edge of a connection between the torsion bar 13b and the mirror section 9 ("the first connection" in the present invention).

When the mirror section 9 has an elliptical shape, then the end edge of the connection between the torsion bar 13b and the mirror section 9 exists on the tangent of the mirror section 9 that is orthogonal to the Y-axis.

Further, as illustrated, when the movable frame 8 has an elliptical shape, then a straight line s2 that connects the end points of the curves (the points where the curvature changes) constituting the movable frame 8 (elliptically shaped) is the end edge of a connection between the torsion bar 13b and the movable frame 8 ("the second connection" in the present invention).

When the movable frame 8 has a circular shape, then the end edge of the connection between the torsion bar 13b and the movable frame 8 also exists on the straight line that connects the end points of the curves constituting the movable frame 8.

The length of the torsion bar 13b becomes clear by defining the end edge of the connection between the torsion bar 13b and the mirror section 9 (the tangent s1) and the end edge of the connection between the torsion bar 13b and the movable frame 8 (the straight line s2) as described above.

Next, FIG. 4 is an enlarged view of the area S in FIG. 3. Here, the dimension of each portion of the torsion bar 13b (hereinafter referred to as "the torsion bar 13") will be described.

In the light deflector 2 described above, the end edge of the torsion bar 13 on the mirror section 9 side is the tangent s1. Further, the end edge of the torsion bar 13 on the movable frame 8 side is the straight line s2. Therefore, the distance between the tangent s1 and the straight line s2 is a length L of the torsion bar 13.

In the torsion bar 13 of the present embodiment, a transverse width $W_1$ of the end edge is 320 μm. Further, a transverse width $W_2$ of the central part in the length direction of the torsion bar 13 (the distance from the end edge being L/2: on straight line m) is 160 μm. The torsion bar 13 is configured only by curves such that the transverse width gradually decreases toward the central part in the length direction from the end edge. The transverse width of a conventional linear torsion bar ($W_1=W_2$) is 220 μm (not illustrated).

Further, a distance $W_3$ in the drawing is determined by $W_3=(W_1-W_2)/2$. At this time, a transverse width $W_4$ of the torsion bar 13 at the middle between the end edge of the torsion bar 13 (the tangent s1 or the straight line s2) and the central part in the length direction of the torsion bar 13 (the distance from the end edge being L/4: on a straight line n) preferably satisfies a condition of $W_2+N \times W_3$ (N=0.30 to 0.35).

For example, if the transverse width $W_1$=320 μm and the transverse width $W_2$=160 μm, then the distance $W_3$ can be calculated as 80 μm and the transverse width $W_4$ can be calculated as 186 μm when N=0.325. Therefore, the curve shape of the torsion bar 13 may be designed such that the transverse width $W_1$, the transverse width $W_2$, and the transverse width $W_4$ are satisfied.

Here, the principle of the high performance of the torsion bar 13 of the present embodiment will be described with reference to FIG. 5.

Figure 5A:
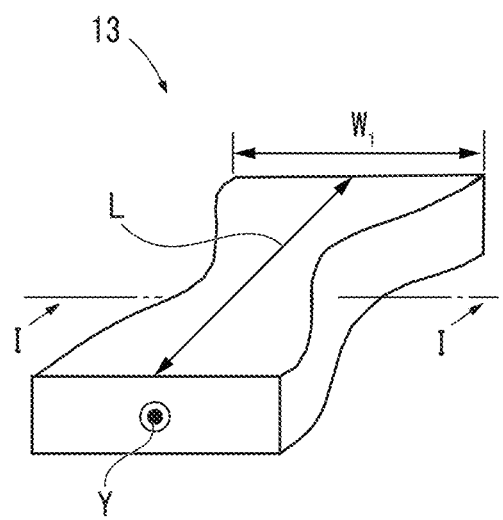
FIG. 5A is an overall perspective view of a torsion bar.

FIG. 5A is a perspective view of the torsion bar 13. As illustrated, the torsion bar 13 has a constricted shape in which the transverse width $W_1$ at the end edges is the largest and the transverse width gradually decreases toward the central part in the length direction. Both ends of the torsion bar 13 are the fixed ends of a torsional motion, so that the central part in the length direction is at the position farthest from the fixed ends, and a large stress is generated therein.

Figure 5B:
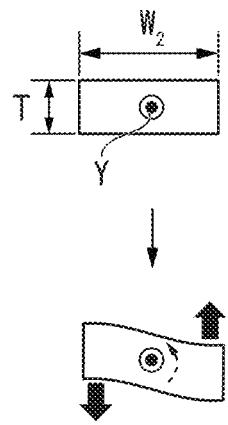
FIG. 5B is a sectional view taken on line I-I of the torsion bar.

FIG. 5B is a sectional view taken on line I-I of the torsion bar 13 in FIG. 5A. As illustrated in the sectional view (the upper one), the cut end is a rectangle having a transverse width $W_2$ (=160 μm) and a thickness T. The transverse width $W_2$ is smaller than the transverse width (220 μm) of the conventional linear torsion bar. The reduction in the transverse width $W_2$ decreases the length of the arm from the rotation axis (the Y-axis), and the moment of inertia decreases, so that rotational torque (=moment of inertia× angular acceleration) is suppressed and distortion is also reduced.

The torsion bar 13 of the present embodiment has a structure in which the central part thereof is twisted more easily than at both ends thereof. The torsion bar 13 can suppress distortion as compared with the conventional structure, thus making the torsion bar 13 less likely to be damaged. Consequently, the torsion bar 13 allows a larger limit deflection angle of the mirror section 9 while maintaining high resonance frequency characteristics.

The thickness T of the torsion bar 13 is set to be approximately 25% of the transverse width $W_2$ of the torsion bar 13. The transverse width $W_2$ of the torsion bar 13 of the present embodiment is 160 μm, so that the thickness T can be decreased to 40 μm or less.

Figure 6:
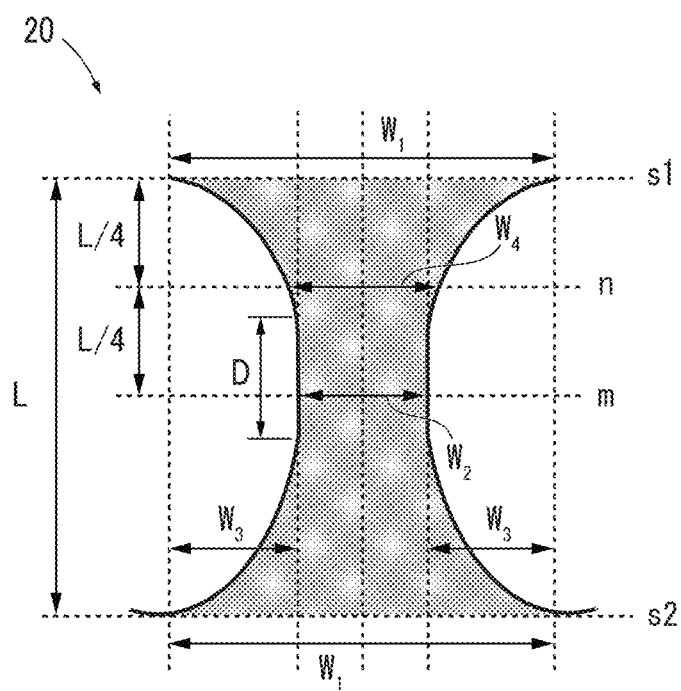
FIG. 6 is a diagram illustrating a torsion bar (in a modified form)

The torsion bar 13 illustrated in FIG. 5 may be a torsion bar that has the same transverse widths $W_1$ and $W_2$, and is partly linear. FIG. 6 illustrates a torsion bar 20 in a modified form that has a linear part D.

The linear part D includes the central part in the length direction of the torsion bar 20, so that the transverse width $W_2$ indicates the part having the smallest transverse width of the torsion bar 20. The linear part D is preferably 25% or less of the overall length L of the torsion bar 20. If this condition is satisfied, then characteristics equivalent to those of the torsion bar 13 of FIG. 4 are maintained (details will be described later).

Referring now to FIG. 7, a description will be given of an example of a torsion bar that has a constricted shape but exhibits lower performance as compared with the embodiment of the present invention.

Figure 7A:
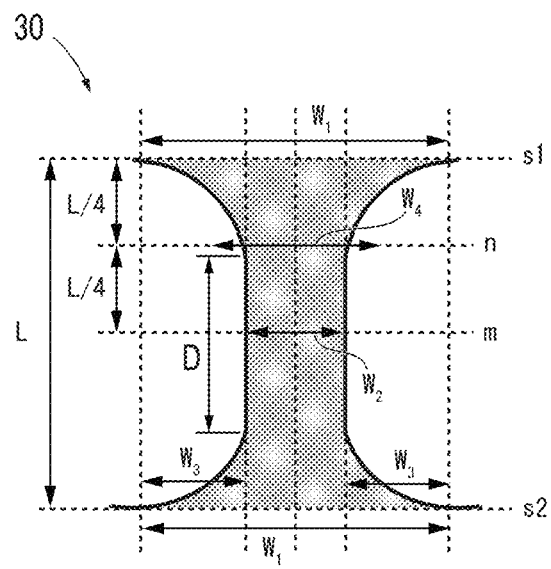
FIG. 7A is a diagram illustrating a torsion bar (reference example A)

A torsion bar 30 (reference example A) illustrated in FIG. 7A has a transverse width $W_4$ that is smaller than the aforesaid ideal value (N<0.30). As illustrated, in the torsion bar 30, a linear part D is relatively long in the vicinity of the central part (straight line m) in the length direction. A lower resonance frequency was observed in the torsion bar 30 having this shape (D>0.25×L).

Figure 7B:
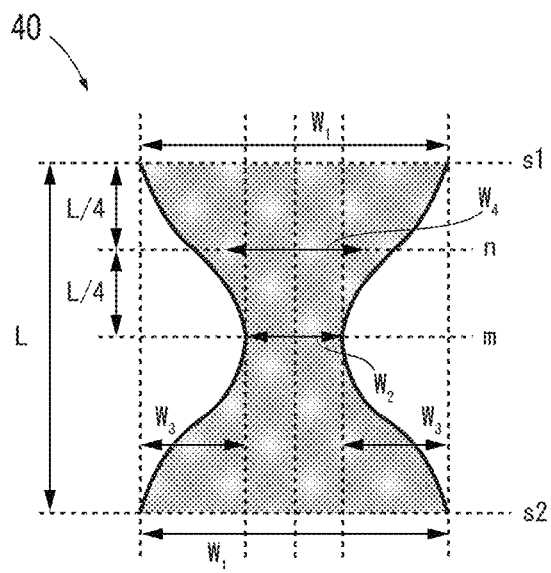
FIG. 7B is a diagram illustrating a torsion bar (reference example B)

Further, a torsion bar 40 (reference example B) illustrated in FIG. 7B has a transverse width $W_4$ that is larger than the aforesaid ideal value (N>0.35). As illustrated, in the torsion bar 40, a part having a transverse width that is larger than a transverse width $W_2$ occupies the vicinity of the central part (the straight line m) in the length direction of the torsion bar 40. Consequently, the torsion bar 40 showed a tendency in which the rotational torque increases and the limit deflection angle decreases.

FIG. 8 indicates the simulation results of comparison in performance of torsion bars having different shapes. For this simulation, commercially available software (IntelliSuite) was used to measure the resonance frequency [Hz] and the limit deflection angle [°] on the basis of the conventional linear torsion bar.

The torsion bar 13 of FIG. 4 ("New 1" in FIG. 8) has the shape (constricted shape) having the transverse width $W_4$ determined with N=0.325. The torsion bar 13 obtained characteristics, namely, a resonance frequency of 102% and a limit deflection angle of 134%, which were both higher than those of the conventional linear shape. This proved that the shape of the torsion bar 13 of the present embodiment leads to higher performance.

The torsion bar 20 of FIG. 6 ("New 2" in FIG. 8) has the shape having the linear part D, the transverse width $W_4$ being determined with N=0.325. The torsion bar 20 obtained characteristics, namely, a resonance frequency of 99% and a limit deflection angle of 147%. The limit deflection angle is larger than that of the conventional one. In addition, the result of the resonance frequency was almost the same as that of the conventional one, so that it can be said that a torsion bar may be configured to include the linear part D.

The torsion bar 30 of FIG. 7A ("Reference example A" in FIG. 8) has the shape having the transverse width $W_4$ determined with N=0.150. The obtained results showed that the torsion bar 30 had a resonance frequency of 106% and a limit deflection angle of 98%. Further, the torsion bar 40 of FIG. 7B ("Reference example B" in FIG. 8) has the shape in which the transverse width $W_4$ is determined with N=0.500. The torsion bar 40 obtained results of a resonance frequency of 109% and a limit deflection angle of 89%. The scanning range of the mirror section 9 narrows as the limit deflection angle decreases, so that it was determined that these reference examples are configurations that deteriorate performance.

Lastly, referring to FIG. 9, a description will be given of the comparison in performance between the conventional structure and the new structures of the torsion bars.

In the conventional linear torsion bar, the transverse width $W_2$ of the central part (the straight line m) was 220 μm, the resonance frequency was 19,849 Hz, and the limit deflection angle was 11.9°. The rotational torque is compared by "ratio," so that the conventional structure was defined as "1."

On the other hand, in the new torsion bar 13 having the constricted shape, the transverse width $W_2$ of the central part (the straight line m) is 160 μm, which is 73% of that of the conventional torsion bar. The resonance frequency of the torsion bar 13 was 19,886 Hz, which was substantially the same value as that of the conventional structure. The limit deflection angle was 13.8°, which indicates an increase to 116% from that of the conventional torsion bar. In addition, the rotational torque has been successfully suppressed to 40% of that of the conventional torsion bar.

From the above, the torsion bar 13 having the new structure is not only less likely to be damaged as compared with the conventional structure, but also provides superior device characteristics. The light deflector of the present invention can also be applied to products for which there is a high demand for miniaturization and thinning.

The embodiment described above is merely an example, and various modified forms are possible. If the mirror section 9 has a rectangular shape, then the side of the mirror section 9 that is adjacent to the torsion bar 13b is the end edge of the connection. If the movable frame 8 has a rectangular shape, then the side of the movable frame 8 that is adjacent to the torsion bar 13b is the end edge of the connection.

DESCRIPTION OF REFERENCE NUMERALS

1 . . . optical scanner module; 2 . . . light deflector; 3 . . . light source; 4a, 4b . . . laser light; 5 . . . control device; 6a, 6b bellows-shaped piezoelectric actuator; 7a1 to 7a8 and 7b1 to 7b8: electrode pad; 8 . . . movable frame; 8a . . . inner frame body; 8b . . . outer frame body; 9 . . . mirror section; 10a, 10b . . . semi-annular piezoelectric actuator; 11 . . . outer frame support; and 13, 13a, 13b, 20, 30, 40 . . . torsion bar

What is claimed is:

1. A light deflector comprising:
a mirror section that reflects light;
a frame body provided in such a manner as to surround the mirror section;
a pair of torsion bars having one end of each torsion bar connected to the mirror section and the other end thereof connected to the frame body on an axis passing through a center of the mirror section; and
a piezoelectric actuator that is provided on the frame body and rotates the torsion bars around the axis in a reciprocating manner,
wherein the torsion bar has a constricted shape in which, in a case where a connection between the torsion bar and the mirror section is defined as a first connection and a connection between the torsion bar and the frame body is defined as a second connection, a transverse width at the first connection and the second connection is the largest and the transverse width gradually decreases toward a central part in a length direction, and
wherein the transverse width at the first connection or the second connection of the torsion bar is denoted by $W_1$, a transverse width at the central part of the torsion bar in the length direction is denoted by $W_2$, and $(W_1-W_2)/2=W_3$, and
wherein a transverse width $W_4$ of the torsion bar at a middle part halfway between the first connection or the second connection and the central part in the length direction is $W_2+(0.30\times W_3)$ or more and $W_2+(0.35\times W_3)$ or less.

2. The light deflector according to claim 1, wherein the mirror section has a circular shape or an elliptical shape, and an end part of the torsion bar on a first connection side is on a tangent of the circular shape or the elliptical shape of the mirror section, the tangent being orthogonal to the axis.

3. The light deflector according to claim 1, wherein the frame body has a circular shape or an elliptical shape, and an end part of the torsion bar on a second connection side is on a straight line that connects end points of curves constituting the circular shape or the elliptical shape of the frame body.

4. The light deflector according to claim 1,
wherein the torsion bar has a linear part that includes the central part in the length direction, and
the linear part is 25% or less of a total length of the torsion bar.

5. The light deflector according to claim 1, wherein the torsion bar is configured only by curves.

6. The light deflector according to claim 1, wherein:
the transverse width at the second connection of the torsion bar is denoted by $W_5$, the transverse width at the central part of the torsion bar in the length direction is denoted by $W_6$, and $(W_5-W_6)/2=W_7$, and
a transverse width $W_8$ of the torsion bar at a middle part halfway between the second connection and the central part in the length direction is $W_6+(0.30 \times W_7)$ or more and $W_6+(0.35 \times W_7)$ or less.

7. The light deflector according to claim 6, wherein:
the mirror section has a circular shape or an elliptical shape, and
an end part of the torsion bar on a first connection side is on a tangent of the circular shape or the elliptical shape of the mirror section, the tangent being orthogonal to the axis.

8. The light deflector according to claim 6, wherein:
the frame body has a circular shape or an elliptical shape, and
an end part of the torsion bar on a second connection side is on a straight line that connects end points of curves constituting the circular shape or the elliptical shape of the frame body.

9. The light deflector according to claim 6, wherein:
the torsion bar has a linear part that includes the central part in the length direction, and
the linear part is 25% or less of a total length of the torsion bar.

10. The light deflector according to claim 6, wherein the torsion bar is configured only by curves.

\* \* \* \* \*